Jan. 2, 1968 J. G. QUETSCH, JR., ET AL 3,361,592

SEMICONDUCTOR DEVICE MANUFACTURE

Filed March 16, 1964

John Q. Quetsch, Jr.
Frank J. Saia,
INVENTORS,
BY.

Charles S. Haughey

ATTORNEY.

United States Patent Office 3,361,592
Patented Jan. 2, 1968

3,361,592

SEMICONDUCTOR DEVICE MANUFACTURE

John G. Quetsch, Jr., Anaheim, and Frank J. Saia, Costa Mesa, Calif., assignors to Hughes Aircraft Company, Culver City, Calif., a corporation of Delaware
Filed Mar. 16, 1964, Ser. No. 352,148
13 Claims. (Cl. 117—212)

This invention relates to semiconductor device manufacture, and more particularly to low crystal penetration metal contact formation. It is particularly advantageous in silicon device manufacture where the strength of an alloy bonded contact is desirable without deep crystal penetration, and where subsequent operation at relatively high temperatures require a stable structure at such high temperatures.

In the manufacture of surface passivated semiconductor devices, it is desirable to provide a layer of glass over a device surface, and in silicon devices an intervening layer of silicon dioxide is often preferred. Glasses suitable for such applications on silicon include borosilicate glasses, and may be deposited as a frit from a suspension and then sintered, or fused, to form a continuous, bonded and bubble-free layer. A typical borosilicate glass for this purpose may be sintered at about 800° C. for about 6 minutes at temperature. It is accordingly necessary that devices to be glass passivated, or coated, must have metal contacts for lead attachment which can tolerate this glass fusion step at the glass softening temperature range.

In some devices it is desirable to provide a relatively large metal contact mass for lead attachment, particularly in very small devices which are packaged with end plate electrodes contacting the device metal contact without intervening wire leads. Such metal contacts must then be formed without substantial solution of the crystal at subsequent processing temperatures, such as glass fusion temperatures.

In silicon semiconductor technology fabrication problems are severe in that many metals do not easily bond to, or plate on, silicon. Those that do, such as gold, have relatively low eutectic temperatures, and silicon is increasingly soluble therein at higher temperatures. Silver, for example, does not plate well onto silicon, or onto silver-silicon alloy, due perhaps to oxidation of the silicon. Where so plated, silver forms a poor mechanical and electrical bond, and will not alloy well to silicon, or silver-silicon alloy.

The present invention solves the above problems of obtaining penetration of contact metal into the semiconductor crystal, adequate deposit and bonding of contact metal to the crystal, and adequate bonding of contact metal using relatively simple and inexpensive processes and producing very rugged and stable devices well suited for mass production at low cost.

In a typical example a silicon diode is formed having a planar junction forming region and a silicon oxide mask over the planar surface with an aperture over the diffused junction-forming region. A thin film of gold is formed on the junction forming region where the metal contact is desired, preferably by electroplating using the oxide film as a mask. The gold may be alloyed into the surface at about 500° C. to form a gold-silicon eutectic, if desired, but this is not necessary. A second metal, which will supply more volume of the contact metal, is then deposited on the gold or gold silicon, and electroplating through the mask aperture is preferred. The second metal should form an adequate bond without substantially increasing alloy penetration into the crystal, and it should be sufficiently malleable, or soft, that thermal stress will not cause the crystal to break or crack. Silver is preferred for this step for its unusual combination of properties such as low solubility of silicon in silver, not substantially increasing up to glass sintering temperatures, sufficiently soft for large contact use, and a characteristic "quenching" of gold-silicon alloy in that silver addition very rapidly increases the eutectic temperature of the ternary alloy without substantial additional solution of silicon. Further, silver can be diffusion bonded to gold by heating adjacent surfaces to a temperature at which gold will diffuse rapidly into silver without alloy formation, below the silver-gold melting temperatures, or a gold layer on silver or silver-silicon makes satisfactory plating and bonding of silver possible, thus making possible a two-step silver deposit in complex device manufacture.

Although certain noble metals may in some cases be used instead of silver, their cost makes them presently undesirable. Such noble metals include palladium, platinum and rhodium. This invention is therefore primarily directed to the application of silver as a large contact metal to silicon devices in low penetration contacts, particularly suited for glass passivated devices.

Other advantages and characteristics of this invention will become apparent from the description and explanation of the invention. For a further consideration of what we believe to be novel and our invention, attention is directed to the following portion of this specification, including the drawings, which describes the invention and the manner and process for making and using it.

The invention is of primary value where minimum contact penetration into a doped junction forming region is desired, and where a secure metallic contact bond of a sufficient volume of metallic material for suitable lead attachment is desired. Accordingly, the illustration of the invention herein is in connection with the manufacture of a planar diffused epitaxial silicon diode. The single alloy contact which is shown and described herein is illustrative of the application of this invention to the manufacture of high frequency diodes, and emitter contacts of high frequency shallow diffused emitter transistors.

Figure 1:
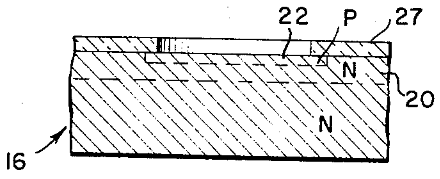
FIGS. 1 through 5 are cross-sectional elevational views of a silicon semiconductor device at successive steps during fabrication thereof according to this invention.

In the drawings, in FIG. 1, a silicon crystal 16 of predominately N conductivity type which may be .005 to .010 ohm centimeter resistance and about 6 mils thick is supplied with an epitaxial layer 20 of N-type which may be of about 1 to 10 ohm centimeters resistivity. A silicon oxide diffusion mask 27 is formed on the surface of the epitaxial layer 20 by any suitable means such as exposure to an atmosphere or argon and water vapor at 1,000° C. for 16 hours, thus producing a film of about 1 to 2 microns thickness, and an aperture is then opened in the oxide film by any desired means such as photochemical masking and etching as illustrated, for example, in U.S. Patents 2,981,877 to Noyce and 3,025,589 to Hoerni. After forming the opening in the film 27, a P-type conductivity determining impurity such as boron is diffused through the opening and into the crystal surface to convert a region 22 thereof adjacent the opening to P-type. Such a process is illustrated in U.S. patents to Hoerni, above, and Derick and Frosch 2,802,760. The formation of the region 22 inherently produces a P–N junction under the protective oxide layer 27; however, the junction is so near the opening that it is preferred to extend the layer 27 further over the region 22 for additional junction protection. This may be done by again subjecting the surface adjacent region 22 to a silicon oxide forming step and reopening a smaller aperture in the reformed film 27.

A film 21 of gold is next deposited on the crystal surface in the opening in the film 27 by any suitable means such as vapor deposit or electroplating. For example, a hydrofluoric acid solution is normally used to form the opening in the silicon oxide film, and this solution may be used to further clean the silicon surface of oxide prior to the gold plating step. A gram of potassium gold cyanide may be dissolved in 100 ml. of water to which 5 cc. of hydrofluoric acid is added. The solution, known as a chemical plate solution, will deposit gold upon the silicon surface. A thickness of about 1,000 angstroms of gold has proven satisfactory. Alternatively an electroplating solution 15 grams of potassium cyanide and 12 grams of potassium gold cyanide in which a liter of deionized water may be used at about 55° C. to electroplate gold on to the silicon. A current of about 5 milliamps may be used with the silicon as a cathode.

The gold film 21 on the silicon region 22 may be alloyed to the surface of the silicon by heating in an inert atmosphere to a temperature above the gold silicon eutectic of 370° C., or to about 500° C. If desired, the first layer of gold may be so deposited and diffused into the silicon at about 1000° C. to kill lifetime in the completed device, and an additional layer of gold may then be deposited over the surface of the region 22.

A volume 23 of silver is next plated onto the gold film of region 22. For this purpose a suitable plating solution may be provided by mixing a liter of deionized water, 130 grams of potassium cyanide, 30 grams of potassium carbonate, 75 grams of silver cyanide, and 15 grams of potassium hydroxide. It is preferred to add a silver brightener such as described in U.S. patent to Kardos 2,666,738. The solution may be electroplated at room temperature or up to about 50° C.

Although the silver 23 may at this point be heated to alloy with the gold coated silicon region 22 to form an adequate permanent bond, it is preferred to cover the surface including the oxide film 27 with a glass frit which may extend over the silver 23 before heating the silver for the alloying step. A borosilicate glass sold as Corning 7040 by Corning Glass Works has thermal expansion characteristics closely matching those of the silicon material, and may be used in this step.

The glass may be applied as a frit deposited from a suspension of the frit in methanol, in a centrifuge. The coated silicon material is next subjected to a fusion operation sufficient to fuse the glass frit to a glass layer 24, and to alloy the silver to the silicon. About 5 minutes at 850° C. is suitable for this procedure. The silver dissolves a small portion of silicon when heated above the 830° C. silver-silicon eutectic, and forms a silver-silicon alloy 25. Penetration of the silver into the silicon crystal is very small, about 2–3 microns, and relatively independent of the fusion temperature or time used because the solubility of silicon in silver between about 830° C. and 950° C. is nearly constant, increasing very slowly with temperature through this temperature range.

Figure 4:
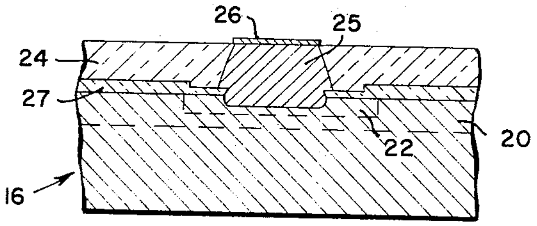

The surface of the silver-silicon alloy 25 is next exposed, as shown in FIG. 4, by polishing the top of the crystal if the silver-silicon alloy projects above the average level of the glass film 24. Otherwise it is necessary to open the glass film over the silver-silicon alloy 25 as by photochemical masking and etching techniques.

To form a sufficiently large volume of silver for subsequent use in making lead attachments, it is usually necessary to adequately bond additional silver to the surface of the silver-silicon alloy. Since silver will not alloy to the silver-silicon at temperatures below the silver-silicon eutectic, with sufficient strength to be useful, a layer 26 of gold is deposited, by electroplating, on the silver silicon alloy and then a layer 29 of silver of relatively large volume is deposited over the gold and will normally extend substantially over the edge of the glass film 24. A plate current of about 150 milliamperes will deposit about 3 to 4 mils of silver in about 4 minutes in the plating procedure previously described. Since the silver will not adhere strongly to the glass, it is necessary to form an exceptionally strong bond through the silver-silicon to the silicon crystal. This is done upon heating with the gold film 26 to about 475 to 490° C. for about 10 minutes followed by slow cooling. If desired, an additional layer of gold plated upon the reverse side of the crystal 16 prior to this step may also be alloyed to the reverse side simultaneously with the alloy-bonding step described. In heating the assembly to about 475 to 490° C. for about 10 minutes, the gold alloys to the silver-silicon 25 forming a gold-silver-silicon alloy 28, and it diffuses into the silver to form a strong diffusion bond with the silver between a gold-diffused region 30 in the silver and the gold-silver-silicon-alloy 28. The time and temperature of this bonding step may be adjusted within the times and temperature at which such alloying and diffusion bonding will occur, but it must be maintained below the 830° C. silver-silicon eutectic temperature to avoid dissolving silicon into the entire silver body, thus increasing greatly the penetration of the silver into and perhaps through the region 22.

Figure 5:
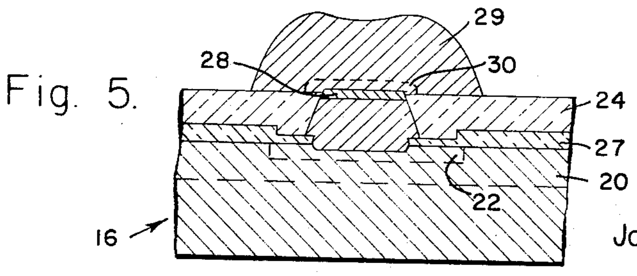
Figure 6:
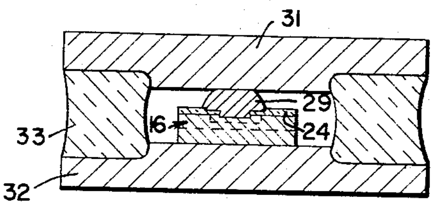
FIG. 6 is a cross-sectional elevational view of the device produced by the foregoing figures in a miniature flat sided and hermetically sealed package.

Although the device of FIG. 5 as above described is now a completed and sealed device and the junction is protected by the silicon dioxide film 27 and the glass film 24, it may be preferred to mount the device into a larger package. This may be done by assembling the completed device 16 between suitable end-plates 31 and 32, which are preferably silver plated, with a surrounding ring of glass 33 and heating the same to hermetically seal the glass ring 33 to end-plates 31 and 32 while simultaneously bonding the end-plates to the silver alloy 30 and the crystal region 17 semiconductor diode device. For this package, the glass ring 33 should have a suitable thermal match with the plates 31 and 32, and should seal adequately thereto. A glass known as Corning Glass No. 8870, sold by Corning Glass Works, Corning, N.Y., is suitable for this purpose, and seals in 3 to 5 minutes at about 710° C. followed by cooling at a rate of not over 38° C. per minute.

Figure 2:
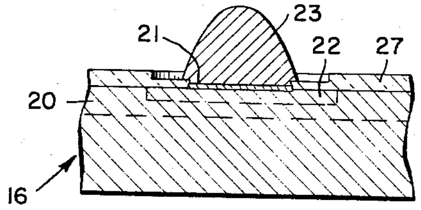

Although the foregoing process produces a low penetration contact, the volumes of the first gold layer 21 and the first silver deposit 23 in FIG. 2 must be quite closely controlled where, as in epitaxial, shallow diffused devices, very low penetration is desired. In ordinary diode manufacture, the penetration by this process is so small as to be quite insensitive to process variations.

Figure 3:
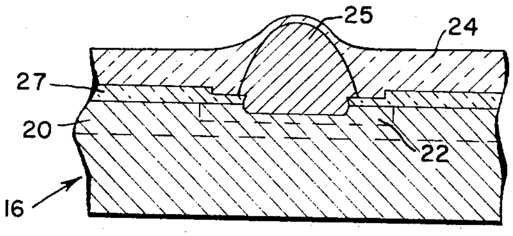

For very fine penetration control, as is very high frequency diodes and planar diffused transistors, this silver and gold contact and bonding system can be further refined to reduce penetration of the crystal markedly. The gold layer 21 should be somewhat heavier, perhaps 2 microns thick, or more, and the same silver layer 23 and glass frit applied. The heating step to form the device of FIG. 3 is carried out below the silver-silicon eutectic temperature of 830° C., preferably at 800° C. for about 6 minutes, to fuse the glass to about a 10 micron layer for the particular glass here disclosed.

The gold layer 21 will alloy with the silicon at about 370° C., and above about 500° C. the gold will diffuse into the silver forming a diffusion bond. This bonding step, therefore, may be done between 500° C. and about 830° C. to avoid silver entering the gold-silicon phase and, due to its great volume as compared to gold, forming the silver-silicon phase 25. The actual temperature is selected to accommodate the fusion temperature and time requirement of the glass for the layer 24.

In this modification, the gold layer 26 is deposited on a silver phase instead of silver-silicon, and after deposit of the second silver volume 29, the gold 26 will bond both silver volumes above about 500° C., but below 830° C., by the diffusion bonding mechanism. The appearance of FIG. 5 would thus be altered to show a second gold diffused silver region like region 30 just below a gold phase at 28, and the volume 25 would, of course, be silver.

Since the example disclosed herein is a glass passivated diode, it is clear that other variations are possible with other passivating materials, or in production of other devices such as transistors, within the scope of the teaching herein.

We claim:

1. A method of manufacturing silicon semiconductor devices, which comprises:
(a) forming a passivating mask on a silicon surface having an aperture in the mask defining a contact area;
(b) depositing a first film of gold on the contact area;
(c) depositing a second film of silver on the first film in a sufficient quantity to extend substantially above the surface of the passivating mask, and
(d) heating to between about 500° C. and 960° C. to bond said films to the silicon at the contact area.

2. A method of claim 1 wherein the first and second films are deposited by electroplating.

3. A method of claim 1 wherein the heating step is below the silver-silicon eutectic temperature and above the lower temperature for diffusion bonding of gold to silver.

4. The method of claim 1 wherein the passivating mask is substantially silicon oxide.

5. A method of forming a metal contact to a silicon semiconductor device, which comprises:
(a) forming a passivating mask on a silicon surface having an aperture in the mask defining a contact area;
(b) depositing a first film of gold on the contact area;
(c) depositing a second film of silver on the first film in a sufficient quantity to extend substantially above the surface of the passivating mask;
(d) depositing passivating glass over the silicon surface; and
(e) heating to below the gold-silver fusion temperature of 960° C. and within the glass fusion temperature range, and at least above the lower gold-silver diffusion bonding temperature of about 500° C. to fuse the glass to a passivating layer and to bond the first and second layers to the silicon.

6. A method according to claim 5 wherein the heating step (e) is between about 500° C. and 830° C. to avoid formation of a silver-silicon phase.

7. A method of manufacturing silicon semiconductor devices, which comprises:
(a) depositing a first layer of gold on a silicon surface of a semiconductor device defined by an apertured passivating film;
(b) depositing a second layer of silver on the gold layer;
(c) heating to between about 500° C. and 960° C. to bond the silver and the gold to the silicon;
(d) depositing a third layer of gold on the second layer;
(e) depositing a fourth layer of silver on the third layer in a sufficient quantity to extend substantially above the surface of the passivating mask; and
(f) heating above about 500° C. and 960° C. to bond the third and fourth layers to the device below the gold-silver melting temperature.

8. A method according to claim 7 wherein the heating steps (c) and (f) are below 830° C. to avoid formation of a substantially silver-silicon eutectic.

9. A method of forming a metal contact to a passivated silicon semiconductor device, which comprises:
(a) depositing a first film of gold on a silicon surface contact area defined by an aperture in the passivating film of said device;
(b) depositing a second film of silver on the first film in a sufficient quantity to extend substantially above the surface of the passivating mask;
(c) depositing a second passivating film material on the surface; and
(d) heating to a temperature above about 500° C. and below about 960° C. to bond the first and second films to the contact area surface.

10. A method according to claim 9 wherein the second passivating film is deposited as a glass frit of a borosilicate glass having a fusion temperature range extending from at least about 800° C., and wherein the heating step (d) is between about 800° C. and 830° C. whereby formation of silver-silicon is avoided.

11. A method according to claim 9, which comprises:
(e) removing the glass from the second film and depositing a third film of gold on the second film;
(f) depositing a fourth film of silver on the third film and in sufficient volume to extend substantially above the adjacent passivating glass film; and
(g) heating to between about 500° C. and 960° C. to bond the third and fourth films to the second film.

12. A method of forming a silicon device, which comprises:
(a) forming a silicon oxide masking film on a silicon surface having an aperture in the film defining a contact area;
(b) depositing a first film of gold on the contact area;
(c) depositing a second film of silver, substantially thicker than the first film on the first film;
(d) depositing a layer of glass frit on the surface;
(e) heating to fuse the glass and to bond the gold and silver to the silicon at the contact area;
(f) depositing a third film of gold on the metal at the contact area;
(g) depositing a fourth film of silver, substantially thicker than the third film, on the contact area; and
(h) heating to fuse the silver and gold of the fourth and third films to the contact area.

13. A method of forming a metal contact to a silicon device, which comprises:
(a) forming a passivating layer on a silicon body having an aperture defining a contact area;
(b) bonding a first metal layer to the body at the contact area by a gold bonding phase;
(c) bonding a second metal layer to the first metal layer by a gold bonding phase.

References Cited

UNITED STATES PATENTS 3,028,663 4/1962 Iwersen et al. ---------- 29—195
3,050,667 8/1962 Emeis -------------- 29—155.5

FOREIGN PATENTS 915,593 1/1963 Great Britain.

WILLIAM L. JARVIS, *Primary Examiner.*